United States Patent
Takahashi (10) Patent No.: US 7,783,456 B2
(45) Date of Patent: Aug. 24, 2010

(54) WAVE DETECTION DEVICE, METHOD, PROGRAM, AND RECORDING MEDIUM

(75) Inventor: Satoshi Takahashi, Saitama (JP)

(73) Assignee: Advantest Corporation, Tokyo (JP)

( * ) Notice: Subject to any disclaimer, the term of this patent is extended or adjusted under 35 U.S.C. 154(b) by 1193 days.

(21) Appl. No.: 10/549,319

(22) PCT Filed: Mar. 16, 2004

(86) PCT No.: PCT/JP2004/003485

§ 371 (c)(1),
(2), (4) Date: Dec. 16, 2005

(87) PCT Pub. No.: WO2004/083875

PCT Pub. Date: Sep. 30, 2004

(65) Prior Publication Data

US 2006/0176979 A1   Aug. 10, 2006

(30) Foreign Application Priority Data

Mar. 19, 2003   (JP)   ............................. 2003-076466

(51) Int. Cl.
*G01R 23/00* (2006.01)
(52) U.S. Cl. .................... 702/189; 324/76.28
(58) Field of Classification Search ............ 702/75–78, 702/124–126, 176, 189–190; 324/76.19–76.24, 324/76.39, 76.41–76.42, 76.28
See application file for complete search history.

(56) References Cited

U.S. PATENT DOCUMENTS 4,965,757 A * 10/1990 Grassart ..................... 702/73
7,127,018 B2 * 10/2006 Yamaguchi et al. ......... 375/371
RE40,280 E * 4/2008 Johnston .................. 704/200.1
RE40,281 E * 4/2008 Tzannes et al. ............. 704/205

FOREIGN PATENT DOCUMENTS

JP   10-023092   1/1998

(Continued)

OTHER PUBLICATIONS

English Language Abstract of JP 11-167565.

(Continued)

*Primary Examiner*—Hal D Wachsman
*Assistant Examiner*—Mary C O'Malley
(74) *Attorney, Agent, or Firm*—Greenblum & Bernstein P.L.C.

(57) ABSTRACT

It is possible to detect a reception signal at a high speed. A wave detection device includes: a first signal output unit for outputting a first signal s[n] which is a sum of a digital input signal subjected to A/D conversion and an output from a feedback signal output section; a second signal output unit for outputting a second signal s[n−1] which is the first signal s[n] delayed by one sampling timing; and a feedback signal output section for subjecting the second signal s[n−1] to a predetermined calculation. When n=N−1, a frequency region conversion section reads out the first signal s[N−1] and the second signal s[N−2] from registers and subjects them to a predetermined calculation, thereby obtaining the input signal subjected to DFT. Since the wave detection device has a simple configuration, it is possible to rapidly detect the reception signal which is an input signal of the wave detection device.

20 Claims, 7 Drawing Sheets

FOREIGN PATENT DOCUMENTS

JP           11-167565        6/1999

OTHER PUBLICATIONS

English Language Abstract of JP 10-023092.
U.S. Appl. No. 10/549,629 to Kato, filed on Sep. 20, 2005.
U.S. Appl. No. 10/557,596 to Nakada, filed on Nov. 22, 2005.
Texas Instruments, Inc.: Modified Goertzel Algorithm in DTMF Detection Using the TMS320C80, Application Report, Digital Signal Processing Solutions, 1996. URL:http://www.ti.com/litv/pdf/spra066 [abgerufen am Oct. 29, 2009].
Banks, Kevin: The Goertzel Algorithm. Embedded Systems Design, Aug. 28, 2002. URL: http://www.embedded.com/story/OEG20020819S0057 [abgerufen am Oct. 29, 2009].

\* cited by examiner

PRIOR ART

WAVE DETECTION DEVICE, METHOD, PROGRAM, AND RECORDING MEDIUM

TECHNICAL FIELD

The present invention relates to a demodulation of a reception signal.

BACKGROUND ART

Figure 7:
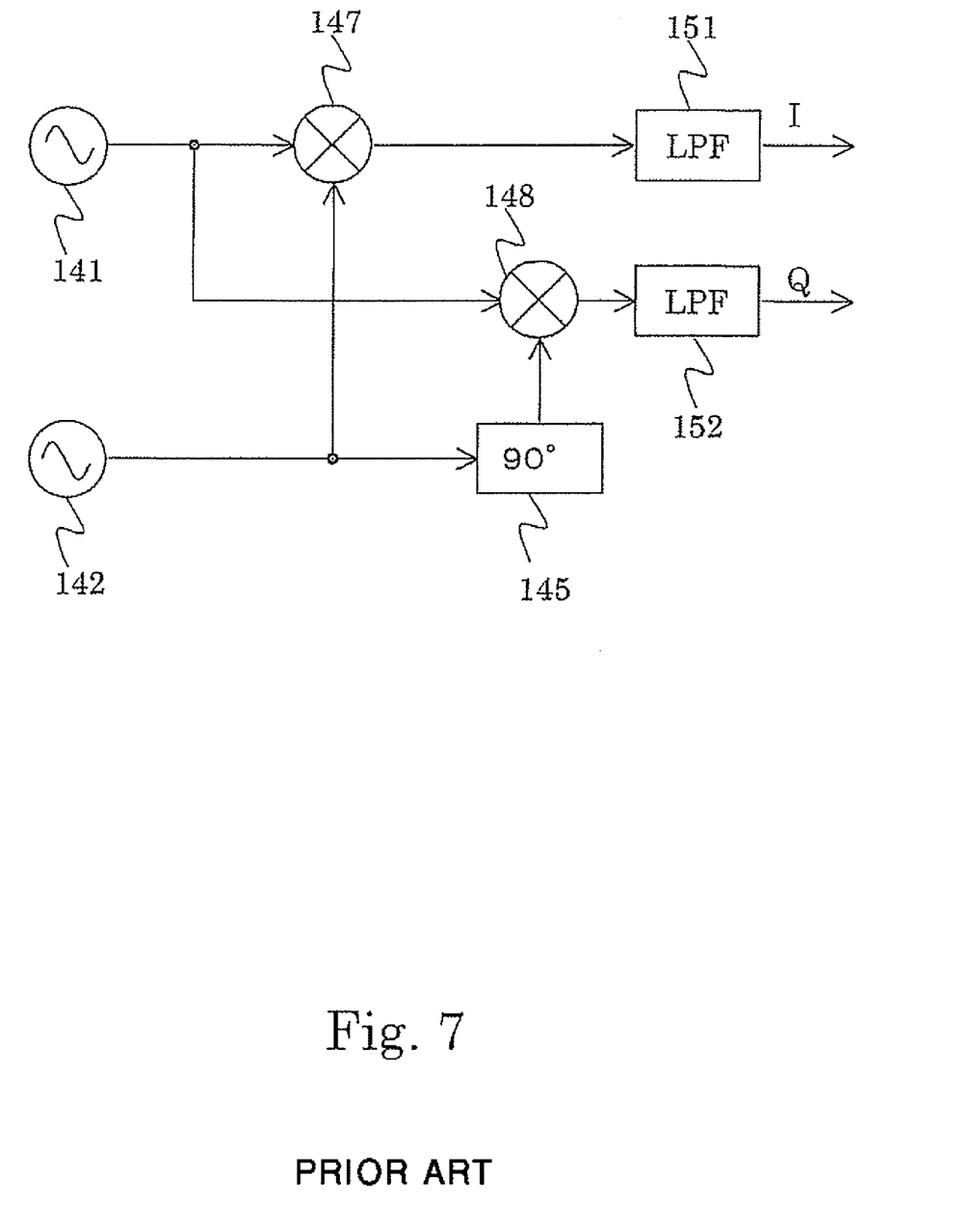
FIG. 7 is a block diagram showing a prior art quadrature detector.

Conventionally, it has been a general practice to detect a reception signal by means of the quadrature detection. The conventional quadrature detector is described in Patent Document 1 (Japanese Laid-Open Patent Publication (Kokai) No. H10-23092 (FIG. 2)), for example. FIG. 7 is a block diagram showing the prior art quadrature detector.

A signal under test output from a signal-under-test source 141 is supplied to multipliers 147 and 148. A reference signal output from a reference signal source 142 is supplied to the multiplier 147, and is simultaneously supplied to the multiplier 148 via a 90-degree phase shifter 145. The multipliers 147 and 148 respectively multiply the supplied signals, and output multiplied results to low-pass filters 151 and 152. Signals after passing the low-pass filters 151 and 152 are respectively referred to as I and Q signals.

The I and Q signals obtained by means of the quadrature detection are processed by a CPU (Central Processing Unit), and the amplitude and phase of the signal under test are then obtained. Moreover, the signal under test output from the signal-under-test source 141 may undergo an A/D conversion.

However, it is difficult to increase the speed of the processing by realizing the quadrature detector described as hardware. If an NCO (Numerical Controlled Oscillator) is employed as the reference signal source 142, for example, the reference signal source 142 has to carry a large sine table. Moreover, if the low-pass filters 151 and 152 are implemented by logic circuits, the amount of logical operations increases. Further, if the CPU receives and processes the I and Q signals, it is necessary to decrease a generation speed of the I and Q signals down to a processing speed of the CPU by means of decimation. If the decimation is carried out, there occurs an aliasing of the signals due to the decimation. It is thus necessary to employ a decimation filter to prevent the aliasing of the signals.

An object of the present invention is to carry out a fast detection of a reception signal.

DISCLOSURE OF THE INVENTION

According to an aspect of the present invention, a wave detection device includes: a digital input signal generating unit that generates a digital input signal by sampling an input signal; a first signal output unit that outputs a first signal obtained by adding the digital input signal to a predetermined signal; a second signal output unit that outputs a second signal obtained by delaying the first signal by one timing period corresponding to one cycle of sampling timing of the digital input signal generating unit; and a frequency domain transform unit that obtains the first signal and the second signal in timing corresponding to every predetermined integer multiple of the one timing period to obtain data which is the input signal transformed into the frequency domain, wherein the predetermined signal is a signal obtained by subtracting a signal obtained by delaying the first signal by the two timing periods from a signal obtained by multiplying a signal obtained by delaying the first signal by the one timing period by a predetermined coefficient.

According to the thus constructed wave detection device, the digital input signal generating unit generates a digital input signal by sampling an input signal. The first signal output unit outputs a first signal obtained by adding the digital input signal to a predetermined signal. The second signal output unit outputs a second signal obtained by delaying the first signal by one timing period corresponding to one cycle of sampling timing of the digital input signal generating unit. The frequency domain transform unit obtains the first signal and the second signal in timing corresponding to every predetermined integer multiple of the one timing period to obtain data which is the input signal transformed into the frequency domain. The predetermined signal is a signal obtained by subtracting a signal obtained by delaying the first signal by the two timing periods from a signal obtained by multiplying a signal obtained by delaying the first signal by the one timing period by a predetermined coefficient.

According to the present invention, the wave detection device may include a feedback signal output unit that outputs a feedback signal obtained by subtracting a signal obtained by delaying the second signal by the one timing period from a signal obtained by multiplying the second signal by the predetermined coefficient, wherein the predetermined signal is the feedback signal.

According to the present invention, the wave detection device may includes: a first feedback signal output unit that outputs a first feedback signal obtained by multiplying the first signal by the predetermined coefficient while the one timing period elapses; and a second feedback signal output unit that outputs a second feedback signal obtained by delaying the second signal by the one timing period, and then inverting the sign of the delayed signal, wherein the predetermined signal is the first feedback signal and the second feedback signal.

According to the present invention, the wave detection device may includes: a third feedback signal output unit that outputs a third feedback signal obtained by multiplying the second signal by the predetermined coefficient; and a second feedback signal output unit that outputs a second feedback signal obtained by delaying the second signal by the one timing period, and then inverting the sign of the delayed signal, wherein the predetermined signal is the third feedback signal and the second feedback signal.

According to the present invention, the input signal may be a recurrence of a transient response, and a steady-state response occurring subsequent to the transient response of a device under test; and the first signal output unit may not output the first signal until the transient response occurs again and then subsides after the frequency domain transform unit obtains the first signal.

According to the present invention, the predetermined coefficient may be set during a period where the transient response occurs again and then subsides after the frequency domain transform unit obtains the first signal.

According to the present invention, the frequency domain transform unit may set the predetermined integer during a period where the transient response occurs again and then subsides after the frequency domain transform unit obtains the first signal.

According to the present invention, a wave detection method includes: a digital input signal generating step of generating a digital input signal by sampling an input signal; a first signal output step of outputting a first signal obtained by adding the digital input signal to a predetermined signal; a second signal output step of outputting a second signal obtained by delaying the first signal by one timing period corresponding to one cycle of sampling timing of the digital input signal generating step; and a frequency domain transform step of obtaining the first signal and the second signal in timing corresponding to every predetermined integer multiple of the one timing period to obtain data which is the input signal transformed into the frequency domain, wherein the predetermined signal is a signal obtained by subtracting a signal obtained by delaying the first signal by the two timing periods from a signal obtained by multiplying a signal obtained by delaying the first signal by the one timing period by a predetermined coefficient.

Another aspect of the present invention is a program of instructions for execution by the computer to perform a wave detection process of a wave detection device having a digital input signal generating unit that generates a digital input signal by sampling an input signal; the wave detection process including: a first signal output step of outputting a first signal obtained by adding the digital input signal to a predetermined signal; a second signal output step of outputting a second signal obtained by delaying the first signal by one timing period corresponding to one cycle of sampling timing of the digital input signal generating step; and a frequency domain transform step of obtaining the first signal and the second signal in timing corresponding to every predetermined integer multiple of the one timing period to obtain data which is the input signal transformed into the frequency domain, wherein the predetermined signal is a signal obtained by subtracting a signal obtained by delaying the first signal by the two timing periods from a signal obtained by multiplying a signal obtained by delaying the first signal by the one timing period by a predetermined coefficient.

Another aspect of the present invention is a computer-readable medium having a program of instructions for execution by the computer to perform a wave detection process of a wave detection device having a digital input signal generating unit that generates a digital input signal by sampling an input signal; the wave detection process including: a first signal output step of outputting a first signal obtained by adding the digital input signal to a predetermined signal; a second signal output step of outputting a second signal obtained by delaying the first signal by one timing period corresponding to one cycle of sampling timing of the digital input signal generating step; and a frequency domain transform step of obtaining the first signal and the second signal in timing corresponding to every predetermined integer multiple of the one timing period to obtain data which is the input signal transformed into the frequency domain, wherein the predetermined signal is a signal obtained by subtracting a signal obtained by delaying the first signal by the two timing periods from a signal obtained by multiplying a signal obtained by delaying the first signal by the one timing period by a predetermined coefficient.

Another aspect of the present invention is a program of instructions for execution by the computer to perform a wave detection process of a wave detection device having a digital input signal generating unit that generates a digital input signal by sampling an input signal; a first signal output unit that outputs a first signal obtained by adding the digital input signal to a predetermined signal; and a second signal output unit that outputs a second signal obtained by delaying the first signal by one timing period corresponding to one cycle of sampling timing of the digital input signal generating unit, the wave detection process including: a frequency domain transform step of obtaining the first signal and the second signal in timing corresponding to every predetermined integer multiple of the one timing period to obtain data which is the input signal transformed into the frequency domain, wherein the predetermined signal is a signal obtained by subtracting a signal obtained by delaying the first signal by the two timing periods from a signal obtained by multiplying a signal obtained by delaying the first signal by the one timing period by a predetermined coefficient.

Another aspect of the present invention is a computer-readable medium having a program of instructions for execution by the computer to perform a wave detection process of a wave detection device having a digital input signal generating unit that generates a digital input signal by sampling an input signal; a first signal output unit that outputs a first signal obtained by adding the digital input signal to a predetermined signal; and a second signal output unit that outputs a second signal obtained by delaying the first signal by one timing period corresponding to one cycle of sampling timing of the digital input signal generating unit, the wave detection process including: a frequency domain transform step of obtaining the first signal and the second signal in timing corresponding to every predetermined integer multiple of the one timing period to obtain data which is the input signal transformed into the frequency domain, wherein the predetermined signal is a signal obtained by subtracting a signal obtained by delaying the first signal by the two timing periods from a signal obtained by multiplying a signal obtained by delaying the first signal by the one timing period by a predetermined coefficient.

BRIEF DESCRIPTION OF THE DRAWINGS

FIGS. 3A to 3D are timing charts of signals, in which.

BEST MODE FOR CARRYING OUT THE INVENTION

A description will now be given of embodiments of the present invention with reference to drawings.

Figure 1:
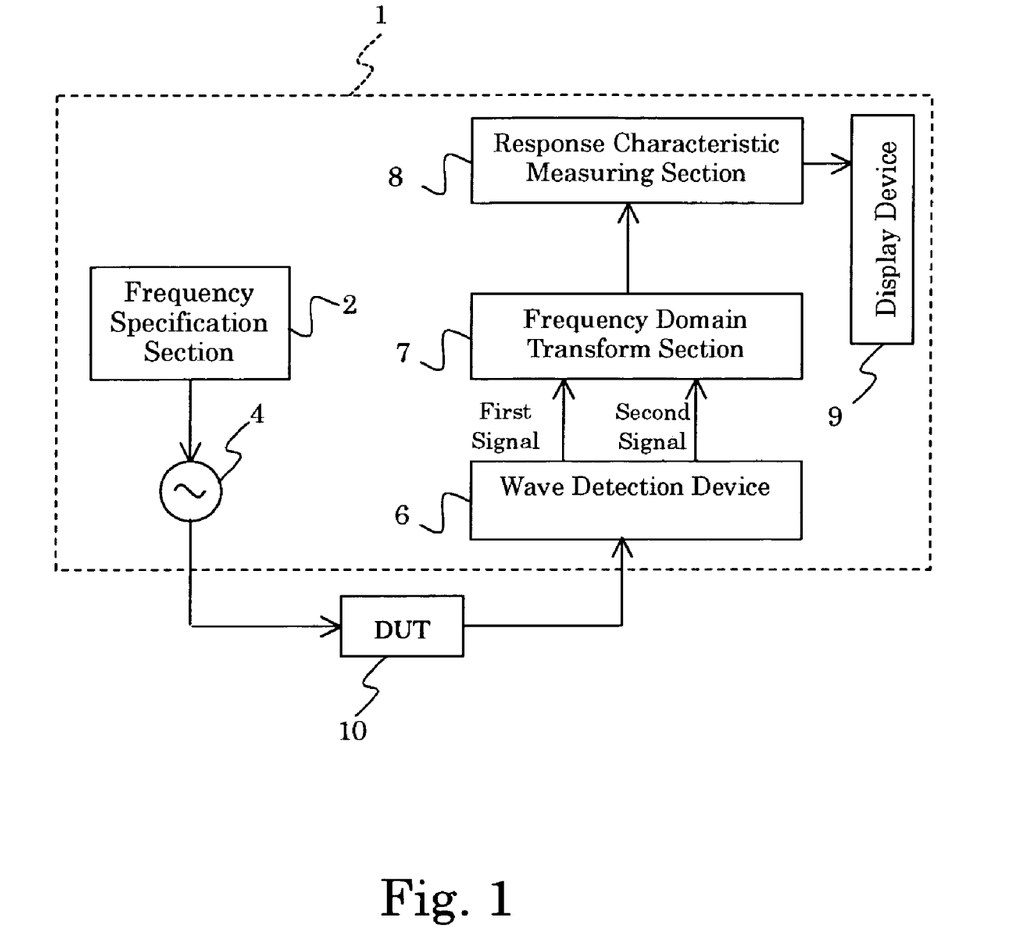
FIG. 1 is a block diagram showing a configuration of a network analyzer 1 employing a wave detection device 6 according to embodiments of the present invention.

FIG. 1 is a block diagram showing a configuration of a network analyzer 1 using a wave detection device 6 according to the embodiments of the present invention. The network analyzer 1 measures response characteristics of a DUT (Device Under Test) 10.

The network analyzer 1 is provided with a frequency specification section 2, an oscillator 4, a wave detection device 6, a frequency domain transform section 7, a response characteristic measuring section 8, and a display device 9.

The frequency specification section 2 specifies the frequency of a signal oscillated by the oscillator 4.

The oscillator 4 receives the specification of the frequency from the frequency specification section 2, and outputs the signal with the specified frequency to the DUT 10.

The wave detection device 6 receives a signal output from the DUT 10 as a result of the reception of the signal from the oscillator 4, detects the signal, and outputs a first signal and a second signal. Note that a description will be given of the first signal and the second signal later.

The frequency domain transform section 7 receives the first signal and the second signal as a result of the detection from the wave detection device 6, and transforms the signals into a signal in the frequency domain.

The response characteristic measuring section 8 obtains an amplitude and a phase of the output from the DUT 10 based upon the signal in the frequency domain obtained by the frequency domain transform section 7. The amplitude and phase of the output represent the response characteristics of the DUT 10. The response characteristic measuring section 8 then outputs the response characteristics to the display device 9.

The display device 9 receives the amplitude and phase of the output of the DUT 10 from the response characteristic measuring section 8, and displays them.

Note that it is possible to realize the frequency specification section 2, the frequency domain transform section 7, and the response characteristic measuring section 8 by recording a program realizing the respective functions thereof in a hard disk, a ROM, or a RAM, and causing the CPU to read out and execute the program. If the network analyzer 1 is provided with a media (such as a floppy disk and a CD-ROM) reading device, it is possible to install the program on the hard disk or the like by causing the media reading device to read the medium recording the program.

First Embodiment

Figure 2:
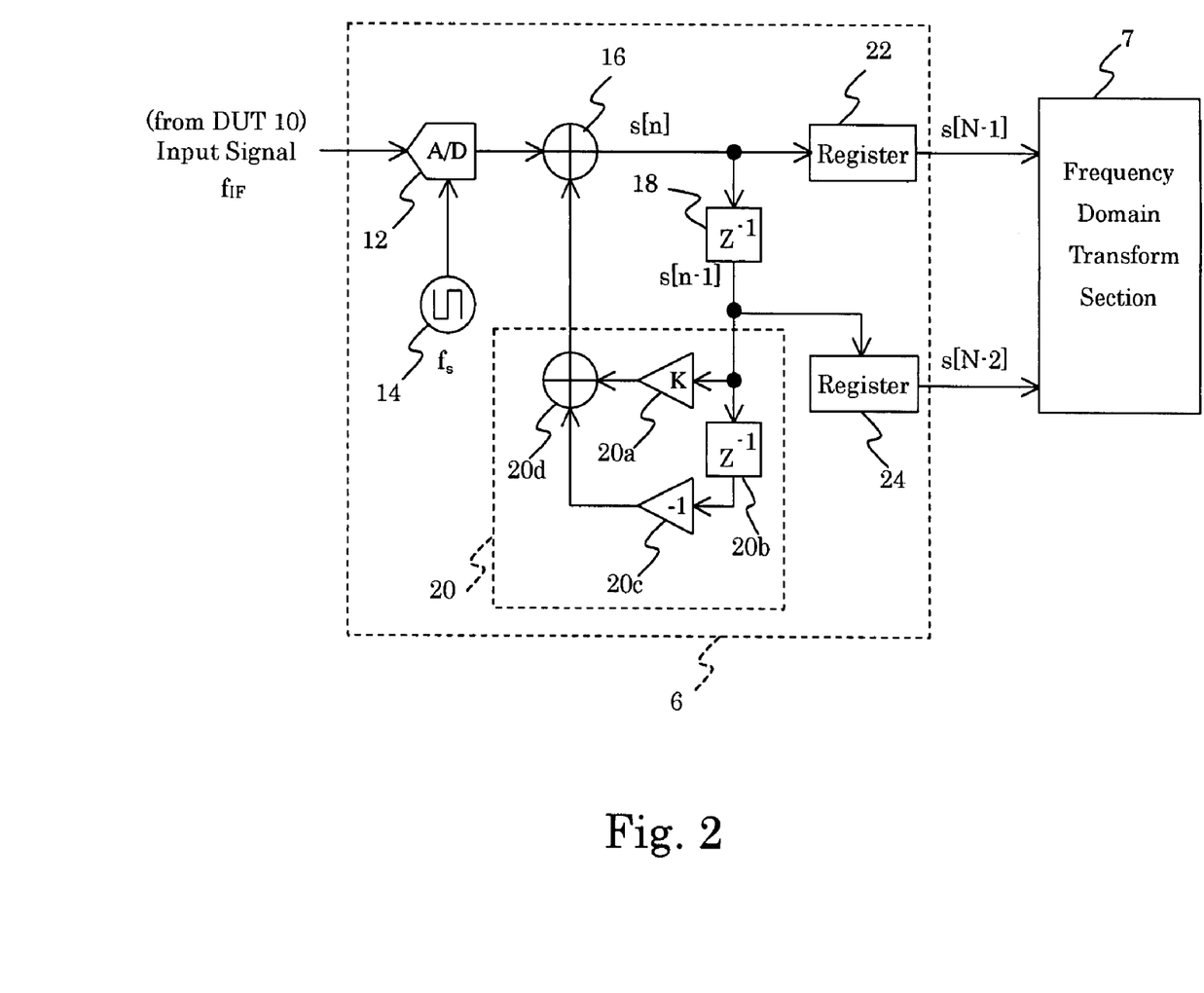
FIG. 2 is a block diagram showing a configuration of the wave detection device 6 according to a first embodiment of the present invention.

FIG. 2 is a block diagram showing a configuration of the wave detection device 6 according to a first embodiment of the present invention. The wave detection device 6 is provided with an A/D converter 12, a clock generator 14, a first signal output unit 16, a second signal output unit 18, a feedback signal output section 20, a first register 22, and a second register 24.

The A/D converter 12 receives the signal output from the DUT 10 as an input signal, transforms the signal into a digital input signal, and outputs the digital input signal. It is assumed that the center frequency of the input signal is $f_{IF}$. A signal sequence of the digital input signal is represented as x[0], x[1], ..., x[n], ..., x[N−1].

The clock generator 14 generates sampling timing of the A/D converter 12. It is assumed that the sampling frequency is $f_s$.

The first signal output unit 16 adds the digital input signal output from the A/D converter 12 to a feedback signal output from the feedback signal output section 20, and outputs a result of the addition. The output from the first signal output unit 16 is referred to as first signal. The first signal is herein represented as s[n]. Note that $0 \leq n \leq N-1$, and s[n] corresponds to x[n].

The second signal output unit 18 receives the first signal, and outputs the first signal delayed by a period corresponding to one period of the sampling timing (referred to as "one timing period" hereinafter). The output from the second signal output unit 18 is referred to as second signal. The second signal is represented as s[n−1]. Since the second signal is obtained by delaying the first signal by the one timing period, the second signal is represented by subtracting one from n of the first signal s[n].

The feedback signal output section 20 includes a constant multiplier 20a, delaying means 20b, a sign inverter 20c, and an adder 20d. The constant multiplier 20a multiplies the second signal by a coefficient K, and outputs a result of the multiplication. K is represented by the following equation. Note that K is a real number.

$$K = 2\cos\left(\frac{2\pi f_{IF}}{f_s}\right) \qquad \text{[Equation 1]}$$

The delaying means 20b delays the second signal by the one timing period, and outputs a result of the delay. The sign inverter 20c inverts the sign of the output from the delaying means 20b. Namely, the sign inverter 20c multiplies the output by "−1". The adder 20d adds the output from the constant multiplier 20a to the output from the sign inverter 20c, and outputs a result of the addition. The output from the adder 20d serves as the feedback signal.

Namely, the feedback signal output section 20 outputs the feedback signal obtained by subtracting the signal obtained by delaying the second signal by the one timing period from the signal obtained by multiplying the second signal by the predetermined coefficient K. The feedback signal is represented as K·s[n−1]−s[n−2].

Since the first signal is obtained by adding the digital input signal output from the A/D converter 12 to the feedback signal output from the feedback signal output section 20, s[n] is represented as x[n]+K·s[n−1]−s[n−2].

The first register 22 receives the first signal output from the first signal output unit 16, and records the first signal. The second register 24 receives the second signal output from the second signal output unit 18, and records the second signal.

Note that the frequency domain transform section 7 reads out the first signal and the second signal respectively from the first register 22 and the second register 24 in every N timing period (N times of the one timing period, N is an integer number), and obtains the signal which is the input signal transformed into the frequency domain. Namely, the wave detection device 6 and the frequency domain transform section 7 apply the DFT (Discrete Fourier Transform) to the input signal. Note that N can be set arbitrarily. If the first signal and the second signal are respectively as s[n] and s[n−1] represented, the result of the transform into the frequency domain is represented as y[n]=s[n]−W·s[n−1]. Note that W is represented by the following equation.

$$W = -\cos\left(\frac{2\pi f_{IF}}{f_s}\right) + j\sin\left(\frac{2\pi f_{IF}}{f_s}\right) \qquad \text{[Equation 2]}$$

In the wave detection device 6, the sampling is carried out at N of sampling points within a certain time window between the start of the sampling to the acquisition of the result of the DFT by the frequency domain transform section 7. Thus, in the DFT carried out by the wave detection device 6 and the frequency domain transform section 7, the transform to the frequency domain is carried out while a range from 0 Hz to the sampling frequency $f_s$ is divided by N. Thus, the frequency resolution increases as N used as the sample number increases. According to the embodiment of the present invention, a bandwidth to detect the input signal is specified, and is determined reflecting a balance between the measurement period and a required bandwidth. For example, if the sampling frequency $f_s$ is 10 MHz, and 100 kHz is required for the bandwidth of detection, there is estimated that N=100 (=10 MHz/100 kHz), and the measurement period is thus 10 µS (=100/10 MHz).

A description will now be given of a principle of the DFT carried out by the wave detection device 6 and the frequency domain transform section 7. The wave detection device 6 and the frequency domain transform section 7 carry out the DFT by means of an algorithm referred to as Goertzel method. The Goertzel method is a method of calculation described below.

The sampled input signal sequence is represented as x[0], x[1], x[n], ..., x[N−1]. The reference numeral N denotes the sample number of the input signal within the time window used for the DFT calculation. The following recurrence equations are calculated for x[n].

$$s[n]=x[n]+K \cdot s[n-1]-s[n-2] \quad (1)$$

$$y[n]=s[n]-W \cdot s[n-1] \quad (2)$$

s[n] represents a parameter used in the course of the calculation, and y[n] represents an output value. An initial value of s[n] is s[−2]=s[−1]=0. In addition, K and W are constants, and are represented as below. Note that $f_{IF}$ represents the frequency of the input signal, and $f_s$ represents the sampling frequency.

$$K = 2\cos\left(\frac{2\pi f_{IF}}{f_s}\right) \quad \text{[Equation 3]}$$

$$W = -\cos\left(\frac{2\pi f_{IF}}{f_s}\right) + j\sin\left(\frac{2\pi f_{IF}}{f_s}\right)$$

The equations (1) and (2) are repeated N times from the input of the sampling signal, and y[n] is thus obtained finally, thereby acquiring the result of DFT. However, the equation (2) represents a filter configuration in a feed-forward type, and required information is y[N−1] obtained after N times of the calculation. It is thus not necessary to always calculate the equation (2), and it is only necessary to calculate once after the N times of the calculation. It is thus necessary to repeat the calculation only for the equation (1). It is only necessary to calculate the equation (2) at a speed of 1/N of the sampling speed. As a result, if the calculation is realized as a program within a computer, the speed thereof is sufficiently practical. Of course, the equation (2) may be realized as a logic operation circuit without any problems.

The equation (1) corresponds to the first signal output from the first signal output unit 16. The equation (2) is obtained by the frequency domain transform section 7, and is a result of transforming the input signal into the frequency domain. It is thus possible to carry out the DFT with the configuration shown in FIG. 2. Since it is only necessary to calculate the equation (2) at the speed of 1/N of the sampling speed, it is necessary for the frequency domain transform section 7 to read out the first signal and the second signal respectively from the first register 22 and the second register 24 in every N timing period.

Figure 3:
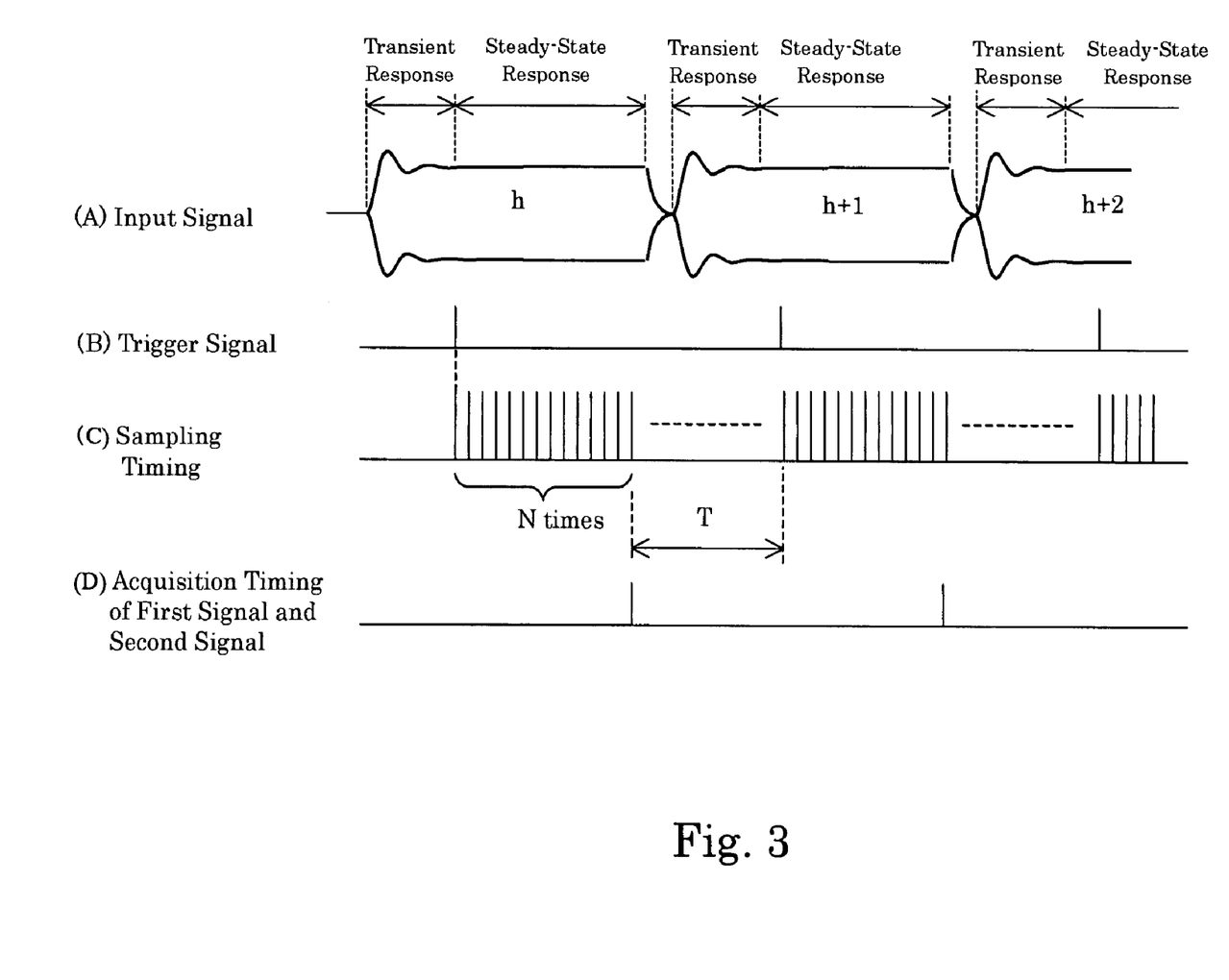
FIG. 3A shows an envelope curve of a signal with a frequency $f_{IF}$ of an input signal.
FIG. 3B shows a trigger signal.
FIG. 3C shows sampling timing.
FIG. 3D shows acquisition timing of a first signal and a second signal by a frequency domain transform section 7.
Figure 4:
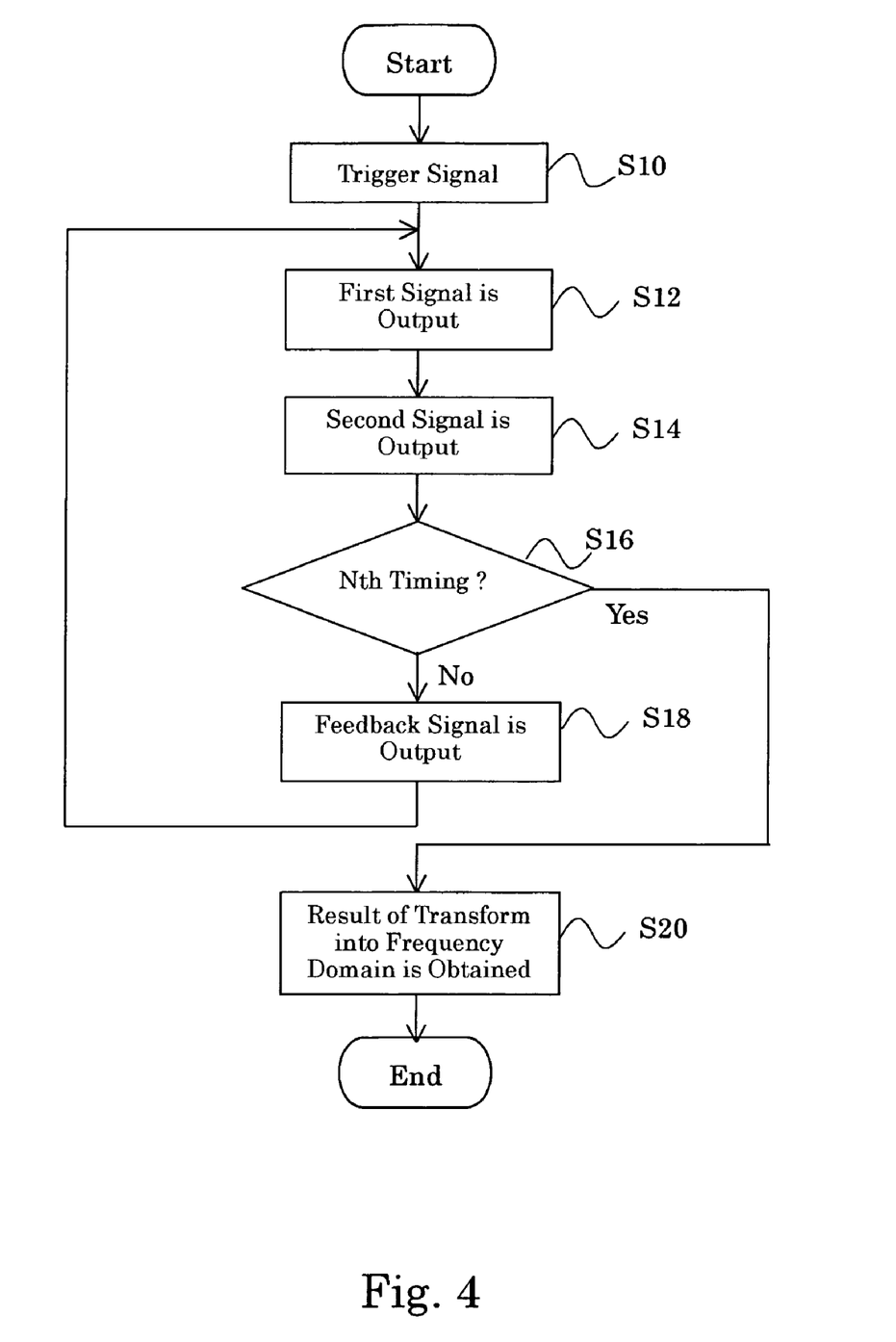
FIG. 4 is a flowchart showing an operation of the embodiment of the present invention.

A description will now be given of an operation of the first embodiment of the present invention with reference to timing charts in FIG. 3 and a flowchart in FIG. 4.

The A/D converter 12 of the wave detection device 6 first receives the signal output from the DUT 10 as the input signal. FIG. 3A shows an envelope curve of the input signal with the frequency $f_{IF}$ received by the A/D converter 12 of the wave detection device 6. As FIG. 3A shows, a beginning part of the input signal corresponds to a transient response and a value thereof is instable. When the transient response subsides, the value thereof becomes stabilized. The section with the stabilized value corresponds to a steady-state response. In this way, the steady-state response occurs subsequent to the transient response.

The clock generator 14 receives a trigger signal which indicates the end of the transient response of the input signal supplied to the A/D converter 12 (S10, refer to FIG. 4), and generates the sampling timing with the sampling frequency $f_s$. FIG. 3B shows the trigger signal, and FIG. 3C shows the sampling timing. As FIG. 3B shows, the trigger signal is generated upon the transient response of the input signal subsiding. As FIG. 3C shows, the sampling timing is repeated at least N times since the generation of the trigger signal. Note that the generation of the sampling timing may be stopped at the Nth timing after the generation of the trigger signal, or may continue.

The A/D converter 12 transforms the input signal into the digital input signal according to the sampling timing from the clock generator 14, and outputs the digital input signal. With reference to FIG. 4, the digital input signal and the feedback signal output from the feedback signal output section 20 are added to each other by the first signal output unit 16, and the first signal is thus output (S12). The first signal is recorded in the first register 22.

Moreover, the first signal is supplied to the second signal output unit 18, is delayed by the one timing period, and is output as the second signal (S14). The second signal is recorded in the second register 24. It is then determined whether the first signal and the second signal have been output corresponding to the trigger signal up to the Nth timing (S16). If they have not been output up to the Nth timing ("No" in S16), the feedback signal output section 20 outputs the feedback signal based upon the second signal (S18). The operation then returns to the output of the first signal (S12).

Note that the determination whether the signals have been output corresponding to the trigger signal up to the Nth timing is made based upon a counter, not shown. The counter is used to count the pulse for each timing period starting from the trigger signal. The counter is cleared by the trigger signal.

If the first signal and the second signal have been output corresponding to the trigger signal up to the Nth timing ("Yes" in S16), the frequency domain transform section 7 reads out the first signal and the second signal from the first register 22 and the second register 24 respectively, and obtains the signal which is the input signal transformed into the frequency domain (S20). FIG. 3D shows the acquisition timing of the first signal and the second signal by the frequency domain transform section 7. It is shown that the first signal and the second signal are obtained by the frequency domain transform section 7 if the signals have been output corresponding to the trigger signal up to the Nth timing.

The wave detection device 6 may not generate the first signal and the second signal until the subsequent trigger signal (S10). With reference to FIG. 3, the first signal and the second signal may not be generated during a period T starting from the first signal and the second signal being obtained (refer to FIG. 3D) for the input signal h (refer to FIG. 3A) to the trigger signal being generated (refer to FIG. 3B) for the input signal h+1 (refer to FIG. 3A).

According to the first embodiment of the present invention, only a signal at a specific frequency point is detected in the input signal, and other frequency components are thus canceled. Namely, the first embodiment provides an effect similar to filtering. Especially, if a higher harmonic is present upon the input signal, a frequency point of the higher harmonic is present at a frequency corresponding to an integer multiple of $f_{IF}/f_s$, a signal with a subject frequency within the input signal and the higher harmonic are completely orthogonal to each other, and the output as a result of the wave detection is advantageously not affected at all. In this way, it is not necessary to provide filters used to filter the first signal and the second signal. If the filter were implemented by a logic circuit to realize it as hardware, the amount of calculation would increase. However, since the filter is not necessary, the amount of the calculation thus is small, and the processing by the wave detection device 6 can be carried out fast.

Moreover, according to the first embodiment of the present invention, the frequency domain transform section 7 is realized by causing the CPU to read and execute the program, and if the wave detection device 6 is realized by hardware, the processing speed of the frequency domain transform section 7 is lower than the processing speed of the wave detection device 6. However, while the wave detection device 6 calculates the first signal and the second signal N times, the frequency domain transform section 7 has to carry out the transform into the frequency domain only once. There thus poses no problem even if the processing speed of the frequency domain transform section 7 is lower than the processing speed of the wave detection device 6. It is not necessary to decrease the processing speed of the wave detection device 6 according to the processing speed of the frequency domain transform section 7. Consequently, the processing by the wave detection device 6 can be carried out fast.

Further, according to the first embodiment of the present invention, the detection bandwidth of the signal is obtained by dividing the sampling frequency $f_s$ by N. It is thus possible to easily change the detection bandwidth by simply changing N.

Still further, according to the first embodiment of the present invention, it is necessary to generate the first signal and the second signal by the wave detection device 6 only within the period from the first trigger signal to the Nth timing. Namely, there is carried out a type of the frame processing. Therefore, the first signal and the second signal may not be generated in the other period (such as the period T (refer to FIG. 3)). It is thus possible to set N in the frequency domain transform section 7 and the predetermined coefficient K in the constant multiplier 20a in the period T, for example.

Yet further, according to the first embodiment of the present invention, since the generation of the first signal and the second signal by the wave detection device 6 is a type of the frame processing, a measured result for the input signal h does not affect a measured result for the input signal h+1. Namely, a previous measured result does not affect a next measured result. As a result, it is not necessary to consider the filter response and the like within the wave detection device as is conventionally necessary.

Note that it is necessary for the conventional quadrature detection method to multiply a signal under test and a reference signal together, resulting in unnecessary signals other than a low frequency component. However, according to the first embodiment of the present invention, since the DFT (Discrete Fourier Transform) is carried out, unnecessary signals are not generated, and the detector output (first signal and second signal) with a better characteristic is obtained.

Still yet further, although the conventional quadrature detection method uses a sinusoidal wave signal as a reference signal, the wave detection device 6 according to the first embodiment of the present invention does not use a sinusoidal wave signal, it is thus not necessary to retain a large sine table, and the processing by the wave detection device 6 is carried out fast.

Second Embodiment

Figure 5:
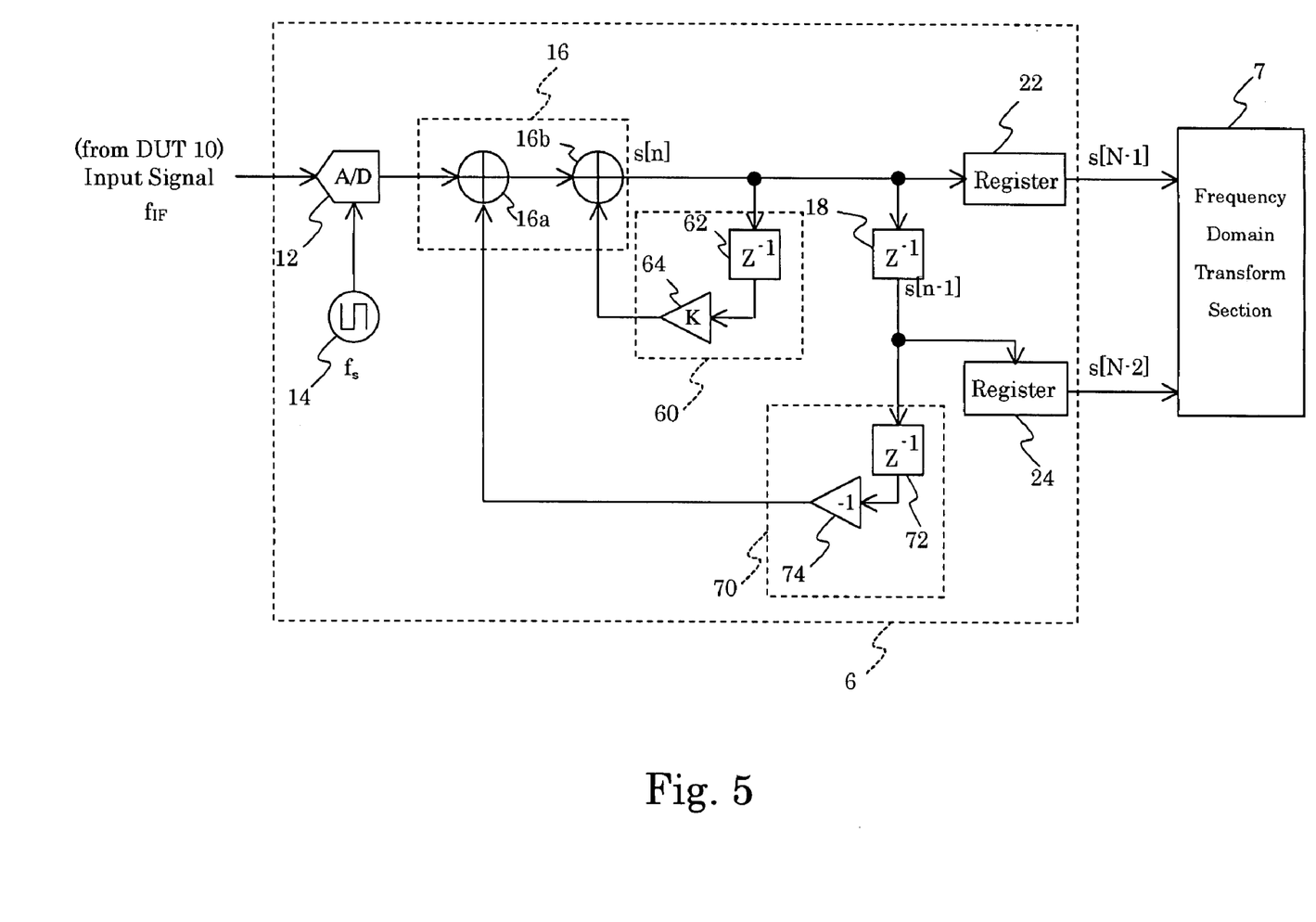
FIG. 5 is a block diagram showing a configuration of the wave detection device 6 according to a second embodiment of the present invention.

The second embodiment is different in employing a first feedback signal output section 60 and a second feedback signal output section 70 in place of the feedback signal output section 20 in the first embodiment.

FIG. 5 is a block diagram showing a configuration of the wave detection device 6 according to the second embodiment of the present invention. The wave detection device 6 is provided with the A/D converter 12, the clock generator 14, the first signal output unit 16, the second signal output unit 18, the first register 22, the second register 24, the first feedback signal output section 60, and the second feedback signal output section 70. In the following section, like components are denoted by like numerals as of the first embodiment, and will be explained in no more details.

The A/D converter 12, the clock generator 14, the second signal output unit 18, the first register 22, and the second register 24 are similar to those of the first embodiment, and will be explained in no more details.

The first signal output unit 16 adds the digital input signal output from the A/D converter 12, a first feedback signal output from the first feedback signal output section 60 and a second feedback signal output from the second feedback signal output section 70 together, and outputs a result of the addition. The output from the first signal output unit 16 is referred to as first signal. The first signal is herein represented as s[n]. Note that $0 \leq n \leq N-1$, and s[n] corresponds to x[n].

The first signal output unit 16 includes a first adder 16a and a second adder 16b. The first adder 16a adds the digital input signal to the second feedback signal, and outputs a result of the addition. The second adder 16b adds the output from the first adder 16a to the first feedback signal, and outputs a result of the addition. The output from the second adder 16b serves as the first signal.

The first feedback signal output section 60 outputs the first feedback signal which is obtained by multiplying the first signal by the predetermined coefficient K while the one timing period elapses. The first feedback signal output section 60 includes delaying means 62 and a constant multiplier 64.

The delaying means 62 delays the first signal by the one timing period, and outputs a result of the delay. The constant multiplier 64 multiplies the output from the delaying means 62 by the predetermined coefficient K, and outputs a result of the multiplication. The output from the constant multiplier 64 serves as the first feedback signal. The predetermined coefficient K is the same as K of the constant multiplier 20a of the first embodiment. The first feedback signal is represented as K·s[n−1].

Generally, if a constant multiplier is realized by only a combinational logic of a logic circuit, the logic becomes complex, and it is difficult to increase the operation speed of the constant multiplier. Thus, it is generally practiced to provide a flip-flop circuit and the like within the constant multiplier, and to cause the flip-flop circuit to hold a temporary result of the calculation to increases the speed of the sampling timing. In this case, the constant multiplier outputs the signal delayed by an amount corresponding to sampling timing for the internal flip-flop with respect to the input signal.

The delay upon the signal being output from the constant multiplier including the flip-flop circuit and the like therewithin provides a function similar to the delaying means. Since the constant multiplier including the flip-flop circuit and the like therewithin provides the function as the delaying means in addition to the function as the constant multiplier, this constant multiplier provides the functions similar to those of the combination of the delaying means 62 and the constant multiplier 64. Consequently, the constant multiplier including the flip-flop circuit and the like therewithin can be used as the first feedback signal output section 60.

Moreover, although the delaying means 62 is provided before the constant multiplier 64 in FIG. 5, the delaying means 62 may be provided after the constant multiplier 64. Namely, the position of the delaying means 62 is not limited to a specific position as long as it is provided within the first feedback signal output section 60.

Moreover, although the constant multiplier including the flip-flop circuit and the like therewithin can be used as the first feedback signal output section 60 as described above, it is possible to employ a constant multiplier which carries out calculation corresponding to several clock periods within the one timing period.

The second feedback signal output section 70 delays the second signal by the one timing period, inverts the sign of a resulting signal of the delay, and outputs a result of the inversion of the sign as the second feedback signal. The second feedback signal output section 70 includes delaying means 72 and a sign inverter 74.

The delaying means 72 delays the second signal by the one timing period, and outputs the result of the delay. The sign inverter 74 inverts the sign of the output from the delaying means 72. Namely, the sign inverter 74 multiplies the output by "−1". The output from the sign inverter 74 serves as the second feedback signal. The second feedback signal is represented as $-s[n-2]$.

The first signal output unit 16 adds the digital input signal $x[n]$, the first feedback signal $K \cdot s[n-1]$ and the second feedback signal $-s[n-2]$ together, and outputs the first signal $s[n]=x[n]+K \cdot s[n-1]-s[n-2]$.

Namely, the first adder 16a adds the digital input signal $x[n]$ to the second feedback signal $-s[n-2]$, and outputs $x[n]-s[n-2]$. The second adder 16b adds the output $x[n]-s[n-2]$ from the first adder 16a to the first feedback signal $K \cdot s[n-1]$, and outputs the first signal $s[n]=x[n]+k \cdot s[n-1]-s[n-2]$.

An operation of the second embodiment of the present invention is similar to that of the first embodiment, and will be explained in no more details (refer to FIG. 3 and FIG. 4).

The second embodiment of the present invention provides effects similar to those of the first embodiment.

Moreover, according to the second embodiment, the constant multiplier including the flip-flop circuit and the like therewithin can be used as the first feedback signal output section 60. The constant multiplier including the flip-flop circuit and the like therewithin can increase the sampling timing speed as described above. As a result, a detection capability of the wave detection device 6 increases as the sampling timing speed of the first feedback signal output section 60 increases.

Further, according to the second embodiment of the present invention, a burden upon the logic circuit is lower than that of the first embodiment, and it is thus possible to increase the operation speed.

Namely, for the second signal output from the second signal output unit 18, the three calculations must be carried out respectively by the constant multiplier 20a, the adder 20d, and the first signal output unit 16 during the one timing period in the first embodiment (refer to FIG. 2). As a result, the arithmetic circuit may be very complex, and the operation speed may extremely decrease as a result.

On the other hand, for the signal output from the delaying means 62, only the two calculations must be carried out by the constant multiplier 64 and the second adder 16b during the one timing period in the second embodiment (refer to FIG. 5). As a result, the arithmetic circuit becomes simple, and the calculation speed can thus increase.

Third Embodiment

Figure 6:
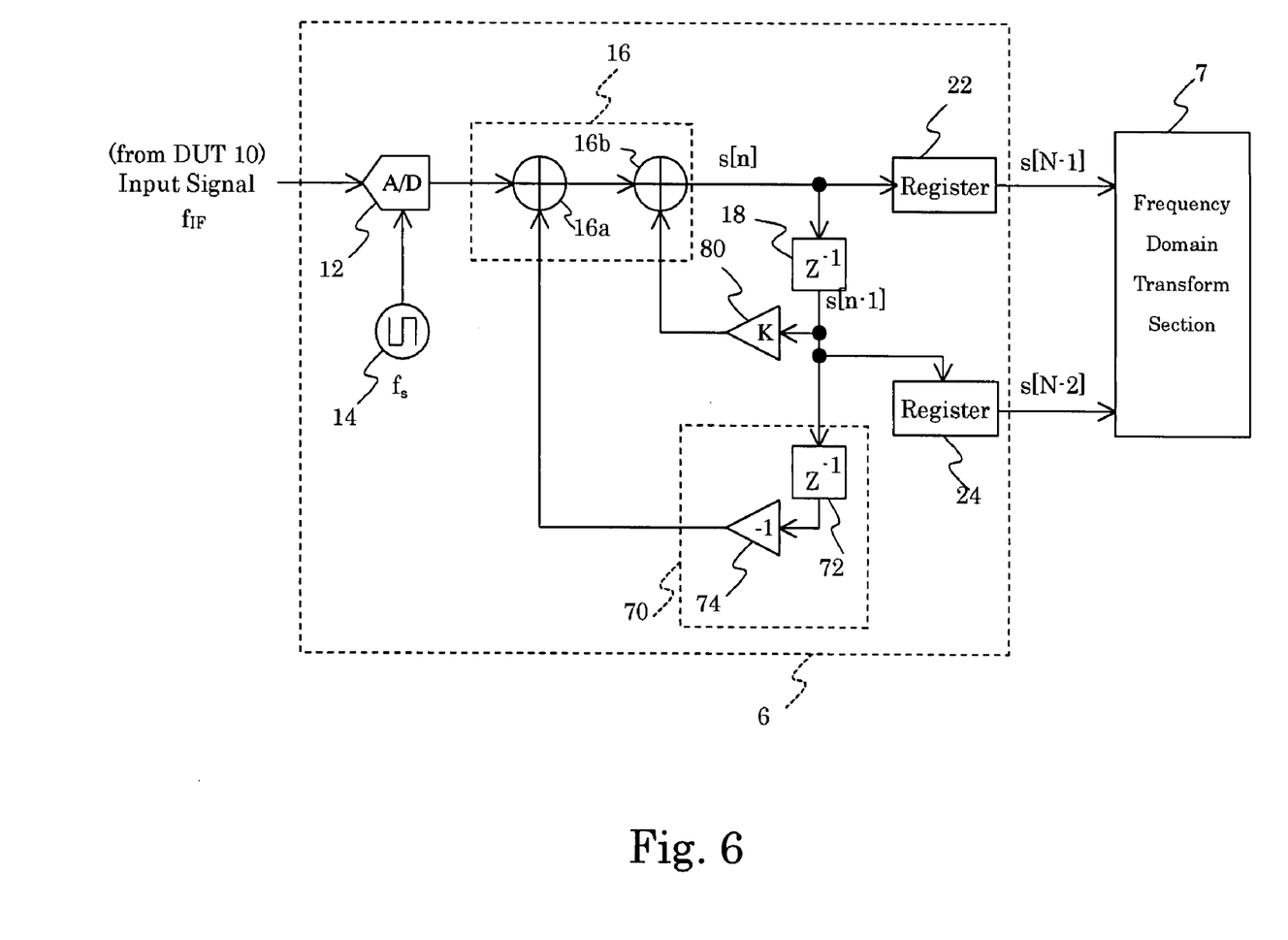
FIG. 6 is a block diagram showing a configuration of the wave detection device 6 according to a third embodiment of the present invention.

The third embodiment is different in employing a third feedback signal output section 80 and the second feedback signal output section 70 in place of the feedback signal output section 20 in the first embodiment.

FIG. 6 is a block diagram showing a configuration of the wave detection device 6 according to the third embodiment of the present invention. The wave detection device 6 is provided with the A/D converter 12, the clock generator 14, the first signal output unit 16, the second signal output unit 18, the first register 22, the second register 24, the second feedback signal output section 70, and the third feedback signal output section 80. In the following section, like components are denoted by like numerals as of the first and second embodiments, and will be explained in no more details.

The A/D converter 12, the clock generator 14, the second signal output unit 18, the first register 22, and the second register 24 are similar to those of the first embodiment, and will be explained in no more details. The second feedback signal output section 70 is similar to that of the second embodiment, and will be explained in no more details.

The first signal output unit 16 adds the digital input signal output from the A/D converter 12, a third feedback signal output from the third feedback signal output section 80 and the second feedback signal output from the second feedback signal output section 70 together, and outputs the result of the addition. The output from the first signal output unit 16 is referred to as first signal. The first signal is herein represented as $s[n]$. Note that $0 \leq n \leq N-1$, and $s[n]$ corresponds to $x[n]$.

The first signal output unit 16 includes the first adder 16a and the second adder 16b. The first adder 16a adds the digital input signal to the second feedback signal, and outputs a result of the addition. The second adder 16b adds the output from the first adder 16a to the third feedback signal, and outputs a result of the addition. The output from the second adder 16b serves as the first signal.

The third feedback signal output section 80 outputs the third feedback signal obtained by multiplying the second signal $s[n-1]$ output from the second signal output unit 18 by the predetermined coefficient K. The predetermined coefficient K is the same as K of the constant multiplier 20a of the first embodiment. The third feedback signal is represented as $K \cdot s[n-1]$.

The first signal output unit 16 adds the digital input signal $x[n]$, the third feedback signal $K \cdot s[n-1]$ and the second feedback signal $-s[n-2]$, and outputs the first signal $s[n]=x[n]+K \cdot s[n-1]-s[n-2]$.

Namely, the first adder 16a adds the digital input signal $x[n]$ to the second feedback signal $-s[n-2]$, and outputs $x[n]-s[n-2]$. The second adder 16b adds the output $x[n]-s[n-2]$ from the first adder 16a to the third feedback signal $K \cdot s[n-1]$, and outputs the first signal $s[n]=x[n]+K \cdot s[n-1]-s[n-2]$.

An operation of the third embodiment of the present invention is similar to that of the first embodiment, and will be explained in no more details (refer to FIG. 3 and FIG. 4).

The third embodiment of the present invention provides effects similar to those of the first embodiment.

Further, according to the third embodiment of the present invention, a burden upon the logic circuit is lower than that of the first embodiment, and it is thus possible to increase the operation speed.

Namely, for the second signal output from the second signal output unit 18, the three calculations must be carried out respectively by the constant multiplier 20a, the adder 20d, and the first signal output unit 16 during the one timing period in the first embodiment (refer to FIG. 2). As a result, the arithmetic circuit may be very complex, and the operation speed may extremely decrease as a result.

On the other hand, for the signal output from the second signal output unit 18, only two calculations must be carried out by the third feedback signal output section 80 and the second adder 16b during the one timing period in the third embodiment (refer to FIG. 6). As a result, the arithmetic circuit becomes simple, and the operation speed can thus increase.

The description is given assuming that the wave detection device 6 is realized by hardware (logic circuit) in the above embodiments. On a computer including a CPU, a hard disk, and a media (such as a floppy disk, and a CD-ROM) reading device, the media reading device may be caused to read a medium recording a program realizing the respective components of the wave detection device 6 (such as the first signal output unit 16, the second signal output unit 18, and the feedback signal output section 20), and the program may be installed on the hard disk. The wave detection device 6 may also be realized in this way.

The invention claimed is:

1. A wave detection device comprising:
    a digital input signal generating means that generates a digital input signal by sampling an input signal;
    a first signal output means that outputs a first signal obtained by adding the digital input signal to a predetermined signal;
    a second signal output means that outputs a second signal obtained by delaying the first signal by one timing period corresponding to one cycle of sampling timing of said digital input signal generating means; and
    a frequency domain transform means that obtains the first signal and the second signal in timing corresponding to every predetermined integer multiple of the one timing period to obtain data which is the input signal transformed into the frequency domain,
    wherein the predetermined signal is a signal obtained by subtracting a signal obtained by delaying the first signal by the two timing periods from a signal obtained by multiplying a signal obtained by delaying the first signal by the one timing period by a predetermined coefficient.

2. The wave detection device according to claim 1 comprising a feedback signal output means that outputs a feedback signal obtained by subtracting a signal obtained by delaying the second signal by the one timing period from a signal obtained by multiplying the second signal by the predetermined coefficient,
    wherein the predetermined signal is the feedback signal.

3. The wave detection device according to claim 1 comprising:
    a first feedback signal output means that outputs a first feedback signal obtained by multiplying the first signal by the predetermined coefficient while the one timing period elapses; and
    a second feedback signal output means that outputs a second feedback signal obtained by delaying the second signal by the one timing period, and then inverting the sign of the delayed signal,
    wherein the predetermined signal is the first feedback signal and the second feedback signal.

4. The wave detection device according to claim 1 comprising:
    a third feedback signal output means that outputs a third feedback signal obtained by multiplying the second signal by the predetermined coefficient; and
    a second feedback signal output means that outputs a second feedback signal obtained by delaying the second signal by the one timing period, and then inverting the sign of the delayed signal,
    wherein the predetermined signal is the third feedback signal and the second feedback signal.

5. The wave detection device according to claim 1,
    wherein the input signal is a recurrence of a transient response, and a steady-state response occurring subsequent to the transient response of a device under test; and
    wherein said first signal output means does not output the first signal until the transient response occurs again and then subsides after said frequency domain transform means obtains the first signal.

6. The wave detection device according to claim 5, wherein the predetermined coefficient is set during a period where the transient response occurs again and then subsides after said frequency domain transform means obtains the first signal.

7. The wave detection device according to claim 5, wherein said frequency domain transform means set the predetermined integer during a period where the transient response occurs again and then subsides after said frequency domain transform means obtains the first signal.

8. A wave detection method comprising:
    a digital input signal generating step of generating, by a signal generator, a digital input signal by sampling an input signal;
    a first signal output step of outputting, by an adder, a first signal obtained by adding the digital input signal to a predetermined signal;
    a second signal output step of outputting, by a delayer, a second signal obtained by delaying the first signal by one timing period corresponding to one cycle of sampling timing of the digital input signal generating step; and
    a frequency domain transform step of obtaining, by a frequency signal transformer, the first signal and the second signal in timing corresponding to every predetermined integer multiple of the one timing period to obtain data which is the input signal transformed into the frequency domain,
    wherein the predetermined signal is a signal obtained by subtracting a signal obtained by delaying the first signal by the two timing periods from a signal obtained by multiplying a signal obtained by delaying the first signal by the one timing period by a predetermined coefficient.

9. A non-transitory computer-readable medium having a program of instructions for execution by a computer to perform a wave detection process of a wave detection device having a digital input signal generating means that generates a digital input signal by sampling an input signal, said wave detection process comprising:
    a first signal output step of outputting a first signal obtained by adding the digital input signal to a predetermined signal;
    a second signal output step of outputting a second signal obtained by delaying the first signal by one timing period corresponding to one cycle of sampling timing of said digital input signal generating step; and
    a frequency domain transform step of obtaining the first signal and the second signal in timing corresponding to every predetermined integer multiple of the one timing period to obtain data which is the input signal transformed into the frequency domain, wherein the predetermined signal is a signal obtained by subtracting a signal obtained by delaying the first signal by the two timing periods from a signal obtained by multiplying a signal obtained by delaying the first signal by the one timing period by a predetermined coefficient.

10. A non-transitory computer-readable medium having a program of instructions for execution by a computer to perform a wave detection process of a wave detection device having a digital input signal generating means that generates a digital input signal by sampling an input signal; a first signal output means that outputs a first signal obtained by adding the digital input signal to a predetermined signal; and a second signal output means that outputs a second signal obtained by delaying the first signal by one timing period corresponding to one cycle of sampling timing of said digital input signal generating means, said wave detection process comprising:
 a frequency domain transform step of obtaining the first signal and the second signal in timing corresponding to every predetermined integer multiple of the one timing period to obtain data which is the input signal transformed into the frequency domain,
 wherein the predetermined signal is a signal obtained by subtracting a signal obtained by delaying the first signal by the two timing periods from a signal obtained by multiplying a signal obtained by delaying the first signal by the one timing period by a predetermined coefficient.

11. A wave detection device comprising:
 a digital input signal generator that generates a digital input signal by sampling an input signal;
 an adder that outputs a first signal obtained by adding the digital input signal to a predetermined signal;
 a delayer that outputs a second signal obtained by delaying the first signal by one timing period corresponding to one cycle of sampling timing of said digital input signal generator; and
 a frequency domain transformer that obtains the first signal and the second signal in timing corresponding to every predetermined integer multiple of the one timing period to obtain data which is the input signal transformed into the frequency domain,
 wherein the predetermined signal is a signal obtained by subtracting a signal obtained by delaying the first signal by the two timing periods from a signal obtained by multiplying a signal obtained by delaying the first signal by the one timing period by a predetermined coefficient.

12. The wave detection device according to claim 11 further comprising a feedback signal output section that outputs a feedback signal obtained by subtracting a signal obtained by delaying the second signal by the one timing period from a signal obtained by multiplying the second signal by the predetermined coefficient,
 wherein the predetermined signal is the feedback signal.

13. The wave detection device according to claim 11, further comprising:
 a first feedback signal output section that outputs a first feedback signal obtained by multiplying the first signal by the predetermined coefficient while the one timing period elapses; and
 a second feedback signal output section that outputs a second feedback signal obtained by delaying the second signal by the one timing period, and then inverting the sign of the delayed signal,
 wherein the predetermined signal is the first feedback signal and the second feedback signal.

14. The wave detection device according to claim 11 comprising:
 a third feedback signal output section that outputs a third feedback signal obtained by multiplying the second signal by the predetermined coefficient; and
 a second feedback signal output section that outputs a second feedback signal obtained by delaying the second signal by the one timing period, and then inverting the sign of the delayed signal,
 wherein the predetermined signal is the third feedback signal and the second feedback signal.

15. The wave detection device according to claim 11,
 wherein the input signal is a recurrence of a transient response, and a steady-state response occurring subsequent to the transient response of a device under test; and
 wherein the adder does not output the first signal until the transient response occurs again and then subsides after said frequency domain transformer obtains the first signal.

16. The wave detection device according to claim 15, wherein the predetermined coefficient is set during a period where the transient response occurs again and then subsides after the frequency domain transformer obtains the first signal.

17. The wave detection device according to claim 15, wherein the frequency domain transformer sets the predetermined integer during a period where the transient response occurs again and then subsides after the frequency domain transformer obtains the first signal.

18. A non-transitory computer-readable medium having a program of instructions for execution by a computer to perform a wave detection process of a wave detection device having a digital input signal generator that generates a digital input signal by sampling an input signal, the wave detection process comprising:
 outputting a first signal obtained by adding the digital input signal to a predetermined signal;
 outputting a second signal obtained by delaying the first signal by one timing period corresponding to one cycle of sampling timing of the digital input signal generating; and
 obtaining the first signal and the second signal in timing corresponding to every predetermined integer multiple of the one timing period to obtain data which is the input signal transformed into the frequency domain,
 wherein the predetermined signal is a signal obtained by subtracting a signal obtained by delaying the first signal by the two timing periods from a signal obtained by multiplying a signal obtained by delaying the first signal by the one timing period by a predetermined coefficient.

19. A non-transitory computer-readable medium having a program of instructions for execution by a computer to perform a wave detection process of a wave detection device having a digital input signal generator that generates a digital input signal by sampling an input signal; an adder that outputs a first signal obtained by adding the digital input signal to a predetermined signal; and a delayer that outputs a second signal obtained by delaying the first signal by one timing period corresponding to one cycle of sampling timing of said digital input signal generator, the wave detection process comprising:
 obtaining the first signal and the second signal in timing corresponding to every predetermined integer multiple of the one timing period to obtain data which is the input signal transformed into the frequency domain,
 wherein the predetermined signal is a signal obtained by subtracting a signal obtained by delaying the first signal by the two timing periods from a signal obtained by multiplying a signal obtained by delaying the first signal by the one timing period by a predetermined coefficient.

20. A wave detection method comprising:

Generating, by a signal generator, a digital input signal by sampling an input signal;

outputting, by an adder, a first signal obtained by adding the digital input signal to a predetermined signal;

outputting, by a delayer a second signal obtained by delaying the first signal by one timing period corresponding to one cycle of sampling timing of the digital input signal generated; and obtaining, by domain transformer, the first signal and the second signal in timing corresponding to every predetermined integer multiple of the one timing period to obtain data which is the input signal transformed into the frequency domain, wherein the predetermined signal is a signal obtained by subtracting a signal obtained by delaying the first signal by the two timing periods from a signal obtained by multiplying a signal obtained by delaying the first signal by the one timing period by a predetermined coefficient.

* * * * *

UNITED STATES PATENT AND TRADEMARK OFFICE
CERTIFICATE OF CORRECTION

| | | |
|---|---|---|
| PATENT NO. | : 7,783,456 B2 | Page 1 of 1 |
| APPLICATION NO. | : 10/549319 | |
| DATED | : August 24, 2010 | |
| INVENTOR(S) | : Satoshi Takahashi | |

It is certified that error appears in the above-identified patent and that said Letters Patent is hereby corrected as shown below:

At column 18, line 1 (Claim 20, line 10) of the printed patent, insert --a frequency-- after "obtaining, by".

Signed and Sealed this
Eighth Day of February, 2011

David J. Kappos
*Director of the United States Patent and Trademark Office*